June 26, 1956 C. A. SHEWMAKER 2,752,580

PRINTED CIRCUIT BOARD AND TERMINAL CONNECTIONS

Filed April 27, 1953

INVENTOR.
CHARLES A. SHEWMAKER
BY George Sipkin
George E. Pearson
ATTORNEYS

United States Patent Office
2,752,580
Patented June 26, 1956

2,752,580

PRINTED CIRCUIT BOARD AND TERMINAL CONNECTIONS

Charles A. Shewmaker, Cheyenne, Wyo.

Application April 27, 1953, Serial No. 351,178
4 Claims. (Cl. 339—17)

This invention relates to printed circuit boards and more particularly to terminal connections for interconnecting the lines on a printed circuit board to a fixed terminal board.

In the accounting, tabulating, statistical analysis, and other arts using electric machines it is now common to provide various interchangeable printed circuits on insulated sheets of material for setting up desired circuit arrangements in conjunction with a control panel having a plurality of terminal points thereon. This interchangeable printed circuit technique is quite advantageous. However, up to this time the various arts have failed to develop a satisfactory means for connecting the printed circuit board to the terminal board, the prior art having been reliant for the most part upon a pressure surface-to-surface contact between the terminal board terminals and the terminals of the interchangeable printed circuit board.

It is accordingly an object of this invention to provide a satisfactory means for interconnecting the terminals of a terminal board with those of a printed circuit board.

A further object is to provide a positive interconnection between a removable circuit board and a terminal board.

Still a further object is to provide an interconnecting means which is positive in its connection yet does not hinder storage of the removable circuit board.

A still further object is to provide an interconnecting device which upon dismantling thereof leaves no protrusions extending from the circuit board.

A still further object is to provide a novel printed circuit board which may be simply and positively connected to a terminal board and which may be easily removed and stored.

Other objects and many of the attendant advantages of this invention will be readily appreciated as the same becomes better understood by reference to the following detailed description when considered in connection with the accompanying drawings wherein.

Figure 1:
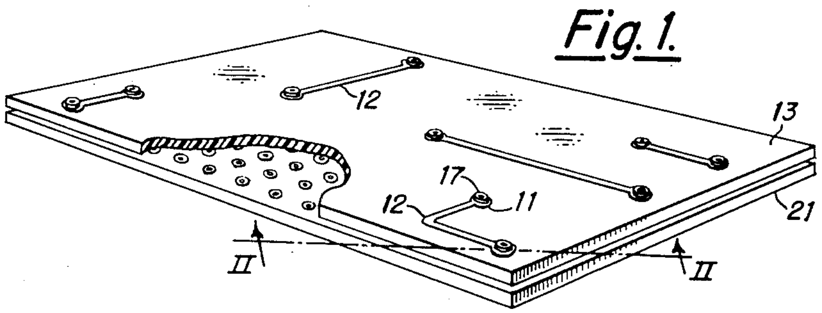
Fig. 1 is a view in perspective of a circuit board and terminal board, connected in accordance with the present invention.

Referring to the figures of the drawing, connecting means are provided for interconnecting the terminals 11 of various printed circuit lines 12, which may be formed on an insulating board 13 in any known or desired manner, as by etching, with the terminals 22 of a terminal board 21, which terminals 22 are connected by any known or desired means to various components of an electrical device.

Figures 2, 3, 4:
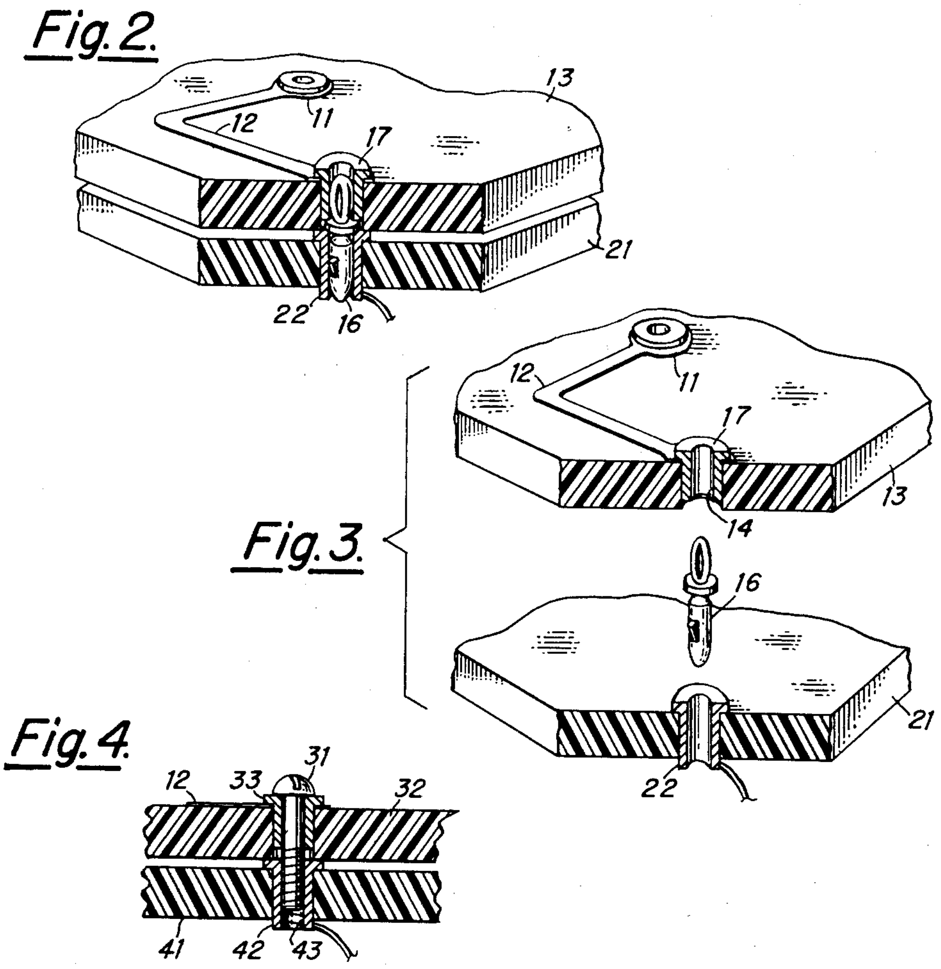
Fig. 2 is a partial cross section taken along line II—II of Fig. 1.
Fig. 3 is an exploded view of Fig. 2 in perspective.
Fig. 4 is a partial cross section showing a modified form of the invention.

In the embodiment shown in Figs. 1–3 the connecting means is comprised basically of three main elements, namely a pair of female banana plugs 14 and 22 and a male banana plug 16.

The terminals 11 of the printed circuit lines 12 are enlarged as compared to the remainder of the line and have formed therein holes. Corresponding holes are formed in the insulating board 13 and into each of these pairs of holes are press fitted a female banana plug 14 which is in the form of a sleeve having a flange 17 at one end thereof. The flange 17 serves to insure proper and positive contact with the thin circuit material, and is advantageous over the mere use of solder at these points in that without the flange the circumferential contact area thus effected between the printed strip 12 and the plug 14 would be quite small and possibly not sufficient in all cases to carry the necessary current present in a given circuit and further is capable of providing a much more uniform impedance at the connection points. The flange 17, as distinguished from soldering or mere circumferential pressure contact between the plug 14 and printed strip 12 affords a uniform current carrying connection without the need for great care being exercised in the fabrication of the connection. In the presently disclosed embodiment the flange 17 is securely held in place against the terminal 11 by the radial pressure exerted on the body of the plug due to the press fit in the insulating board 13.

The corresponding terminal on the terminal board 21 is in the form of a female banana plug 22, or an equivalent, which may be held securely in the terminal board by a press fit, soldering, or any other desired means, and which may connect to various components not shown of the electrical circuit.

The double-ended male banana plug 16 provides the intermediate link in the connecting device and is complementary at one end to female plug 14 in the printed circuit board and at the other end to plug 22 in the terminal board.

In assembling, the circuit board 13 having the desired printed circuits 12 thereon is selected and the male banana plugs 16 are inserted into the circuit terminal plugs 14. It will be apparent that the plugs 16 may be inserted into all or any desired sets of the terminal plugs 14 of the circuit board 13 to obtain the desired circuit connections. Thus by using this invention a single circuit board 13 may be made to serve a plurality of purposes or functions. It will be apparent that this constitutes an important advantage and will in many instances materially reduce the number of various circuit boards required to be kept on hand.

The circuit board 13 with the male plugs 16 therein is then placed in position with the male plugs extending toward the terminal board, and the male plugs are then inserted into the terminal board terminal plugs 22 by pressing the circuit board and plugs 16 toward the control panel. This completes the assembly, and the machine circuitry is rendered ready for use.

The circuit board 13, plugs 16 and terminal board 21 may be disassembled from one another quickly and easily by simply pulling the circuit board 13 away from the terminal board 21 and removing the plugs 16. The circuit board is thus ready for storage, and such may be readily accomplished in the minimum of space since the board is substantially flat and has no large protrusions at the terminal connection points.

A modified form of the invention is illustrated in Fig. 4, wherein a flanged head screw 31 is used in lieu of a banana plug 16. The circuit board 32 with its terminals may be constructed similarly to that shown in Figs. 1–3, wherein flanged female plugs 33 are fitted into terminal holes of the circuit lines 12 and securely held therein against the circuit line material.

The terminal board 41 has terminals thereon which are tapped as shown at 43 the threads of which are complementary to the threads of screw 31. In the embodiment shown, the female plug 33 is not tapped but such may be done if desired to provide additional mechanical and electrical connection.

In assembling, the desired board is placed in aligned position adjacent the terminal board 41 and the desired circuit board and terminal board terminals are interconnected by securing a screw 31 at each desired terminal through the female plug 33 and into the tapped terminal plug 42 at each desired terminal. Disassembly is accomplished by merely unscrewing the screws 31 and removing the circuit board.

With this second embodiment of the invention various of the terminal connections may be removed or added, as the case may be without necessitating removal of the circuit board itself. It will be seen that this will be advantageous in many instances.

As shown in the drawings, both terminals 14 and 33 have a length substantially equal to the thickness of boards 13 and 32 respectively whereby terminal 14 terminates within the board 13 and the board will lie flat when stored. Plug 16 is formed with an outwardly extending flange 15 intermediate the ends thereof which abuts both the end of terminal 14 and the flange of terminal 22 to accurately position the boards 13 and 21 in assembled condition. As will be seen in Fig. 2 the thickness of elements 15, 13 and the length of terminal 14 are so proportioned as to permit the flange of terminal 22 to abut board 13 to afford a more rigid and compact assembly.

Obviously many modifications and variations of the present invention are possible in the light of the above teachings. It is therefore to be understood that within the scope of the appended claims the invention may be practiced otherwise than as specifically described.

Having described my invention, what is claimed is:

1. An electrical interconnecting device for interconnecting a circuit board having a printed line thereon with at least one terminal to a terminal board having at least one terminal thereon, said connecting device comprising a first female flanged plug extending through a terminal of said printed line and having its flange secured in firm contact with the external surface of said line by a press fit between said plug and an insulating sheet onto which said circuit line is affixed, a second female plug at a terminal point of said terminal board, and a double-ended male plug having one end thereof complementary to and releasably held in said first-named female plug and the other end thereof complementary to and releasably held in the other said female plug whereby said terminal of said terminal board is connected electrically to and mechanically to said terminal of said printed line through said first-named female plug, double-ended male plug and second female plug.

2. A connecting device for electrically interconnecting circuitry on two sheets of material, each of which sheets has electrical conductors attached thereto, at least one of said conductors being a printed line on the surface of one of said sheets, said one sheet having an aperture therein, said connecting device comprising a conductive female flanged plug extending through said printed line into said aperture and having its flange in secure contact with said line, and a second conductive female plug in said second sheet of material at a terminal connected to the conductor on said second sheet, and a conductive double-ended male plug having one end thereof complementary to said first-named female plug and the other end complementary to said other female plug, said two female plugs being in alignment and said male plug being releasably held in said female plugs.

3. The device of claim 2 wherein said first female plug terminates within said aperture of said one sheet, said male plug having a flange intermediate the ends thereof, said male plug flange being received within said aperture and respectively abutting adjacent ends of both said female plugs.

4. Apparatus of the character disclosed comprising, in combination, a terminal board having at least one tubular terminal secured therein, a matching insulating board for cooperative engagement with said terminal board and having at least one printed circuit line thereon, said line having an enlarged portion with an opening therein, said insulating board having an opening therein axially aligned with said line opening, a second tubular terminal having a shank portion disposed within said openings and a flange portion disposed in face adjacency with the outer surface of said enlarged line portion, said second terminal having a press fit in said insulating board sufficient to maintain positive electrical contact between the line and the flange portion in the area of said face adjacency, said second terminal having a length substantially equal to the thickness of said insulating board whereby the shank portion thereof terminates within said insulating board, and an electrical conductor member removably receivable in said tubular terminals when the same are axially aligned and having means for mechanical and electrical interconnection thereof, said conductor member comprising a double ended male plug having an outwardly extending flange intermediate the ends thereof, the respective ends of said male plug being snugly received within said tubular terminals, said male plug flange being received within said board opening and respectively abutting said first mentioned terminal and the end of the shank portion of said second terminal.

References Cited in the file of this patent

UNITED STATES PATENTS

| | | |
|---|---|---|
| 1,988,310 | Garrett | Jan. 15, 1935 |
| 2,006,436 | Bowers | July 2, 1935 |
| 2,306,389 | Jorgensen | Dec. 29, 1942 |
| 2,439,412 | Mitchell | Apr. 13, 1948 |
| 2,441,960 | Eisler | May 25, 1948 |
| 2,593,479 | Neiter | Apr. 22, 1952 |
| 2,594,069 | Poehlmann | Apr. 22, 1952 |
| 2,603,681 | Salisbury | July 15, 1952 |
| 2,628,263 | Bulla | Feb. 10, 1953 |
| 2,718,625 | Harrison | Sept. 20, 1955 |

FOREIGN PATENTS

| | | |
|---|---|---|
| 178,650 | Great Britain | Apr. 27, 1922 |